(12) United States Patent
Finch

(10) Patent No.: US 7,482,587 B1
(45) Date of Patent: Jan. 27, 2009

(54) CIRCULAR SILICON SUBSTRATES WITH THIN FILM MEMBRANES FOR ELECTRON MICROSCOPY

(75) Inventor: Dudley Sean Finch, Ashland, OR (US)

(73) Assignee: Dudley S. Finch, Ashland, OR (US)

( * ) Notice: Subject to any disclaimer, the term of this patent is extended or adjusted under 35 U.S.C. 154(b) by 267 days.

(21) Appl. No.: 11/600,398

(22) Filed: Nov. 15, 2006

Related U.S. Application Data

(60) Provisional application No. 60/739,394, filed on Nov. 23, 2005.

(51) Int. Cl.
  *G01N 1/28* (2006.01)
  *G01N 13/16* (2006.01)
  *B01D 63/00* (2006.01)

(52) U.S. Cl. .................... 250/311; 250/309; 250/398; 250/440.11; 438/308; 73/864.91; 216/56; 216/2

(58) Field of Classification Search ............ 250/311, 250/309, 398, 440.11; 438/308; 73/864.91; 216/56, 2
See application file for complete search history.

(56) References Cited

U.S. PATENT DOCUMENTS

2006/0222905 A1* 10/2006 Yasui et al. ................. 428/836
2006/0243655 A1* 11/2006 Striemer et al. ............. 210/490

* cited by examiner

*Primary Examiner*—Nikita Wells

(57) ABSTRACT

The present invention disclosure relates to the use of a silicon substrate with a thin film membrane as a transparent substrate for the imaging of biological- and material-related specimens using a microscope such as a transmission electron microscope (TEM). More specifically, the present invention relates to an improved substrate design that incorporates the fabrication of a circular shape that allows easier insertion into traditional specimen holders used in TEMs. In addition to an improved shape, the present invention incorporates microscopic surface texture on the gripping surface that assists in handling. The invention also encompasses surface modification techniques for enhanced biocompatibility of the thin film membrane for biomedical applications.

12 Claims, 3 Drawing Sheets

Deep reactive ion etching 1 micrometer

Laser processing 10 micrometers

CIRCULAR SILICON SUBSTRATES WITH THIN FILM MEMBRANES FOR ELECTRON MICROSCOPY

This patent is based on the previous provisional patent application number 60/739,394 filed on 23 Nov. 2005.

FIELD OF THE INVENTION

Generally, the present invention relates to the fabrication of a circular silicon substrate with a transparent thin film for the imaging of biological- and material-related samples using a microscope such as a transmission electron microscope (TEM). More specifically, the present invention is an improved substrate design employing fabrication of a circular shape that allows easier insertion into traditional specimen holders used in TEMs. In addition to an improved shape, the present invention incorporates microscopic surface texture on the gripping surface that assists in handling, and also incorporates a modified surface to promote, for example, biological cell adhesion.

DESCRIPTION OF RELATED ART

Silicon substrates with thin film membranes made of silicon nitride for example have been utilized in many applications where optical and electron transparency is required for imaging materials and biological specimens (Ciarlo, 2002). In addition, they have been used as specimen holders, for retention of vacuum, and as substrates for acoustic devices and various thin film structures.

The thickness of silicon nitride used for membranes ranges from 20 nanometers to several micrometers in thickness with the size of these membranes ranging from a few micrometers to a few centimeters.

Fabrication of silicon nitride thin film membranes is derived from techniques used traditionally in the semiconductor industry. One of the key differences of this application is the need to control the residual stress in the silicon nitride film so that it exhibits sufficient tensile strength to remain taut without excessive tensile strength that could lead to rupture of the thin film. The residual stress in the nitride film is controlled by processing parameters. Silicon nitride thin films are typically deposited using a process known as low pressure chemical vapor deposition (LPCVD). This process involves taking silicon wafers (the substrate), placing them in a horizontal tube furnace and exposing them to dichlorosilane (DCS) and ammonia ($NH_3$) at a temperature of 700° C. and a pressure of 40 Pa. The thickness is controlled by the time of exposure. To obtain a true stochiometric composition, silicon nitride requires a ratio of three silicon atoms to four nitrogen atoms ($Si_3N_4$). To achieve this ratio using LPCVD, the flow rate of ammonia is typically three times that of dichlorosilane. Under these conditions however, the silicon nitride films exhibit a very high tensile stress (>1 GPa) and therefore these films are easily fractured, which is naturally undesirable for the given application. It is well known in the field that by increasing the concentration of DCS, it is possible to decrease the residual stress in the silicon nitride thin film and therefore decrease the likelihood of stress fracture of the thin film. This process leads to films that are termed low-stress silicon nitride films and typically have a residual stress in the region of 400 to 800 MPa. It is also common practice to reduce the residual stress still further to produce an ultra low-stress silicon nitride film that has a residual stress in the region of 50 to 400 MPa. This is achieved by increasing the deposition temperature from 825 to 835° C. with the ratio of DCS to ammonia kept around six to one. Under these conditions, the typical deposition rates are approximately five nanometers per minute.

In order to pattern the substrates, the usual practice is the use of lithography to define the shape of the opening beneath the silicon nitride thin film. A photoresist with a thickness of one to ten micrometers is applied via spin-coating onto the silicon wafer. The photoresist is then exposed to UV radiation using a suitable mask that is carefully aligned to the silicon wafer. Regions that are exposed to UV radiation undergo chemical changes that render them insoluble or soluble in a particular solvent depending on whether positive or negative lithography is used. In either case, a portion of the photoresist remains on the silicon substrate and serves to protect it during subsequent processes. Regions of the surface where there is no photoresist serve as areas where patterning can be done to the silicon substrate or to the silicon nitride thin film.

Traditionally, in the fabrication of silicon substrates with a silicon nitride thin film, potassium hydroxide (KOH) is used to remove the silicon material from beneath the silicon nitride thin film. This is achieved by patterning the back side of the wafer and exposing the silicon wafer to KOH at 65° C. at a concentration of around 44 weight percent in water. With this solution strength, the silicon will etch at a rate of 15 to 20 micrometers per hour. The etch rate for silicon nitride using this solution is 0.14 nanometers per hour, which allows for extensive over-etching without significant loss of thickness of the silicon nitride thin film. The final etched pattern of the silicon substrate will depend on the crystallographic orientation of the silicon wafer. The most common wafer used for this type of fabrication process has a (100) orientation. The etch rate in the (100) crystal plane is several hundred times faster than that of the (111) crystal plane. If the mask used to pattern the wafer is aligned to the (110) crystal direction, a square or rectangular aperture will be defined post-etching. In this case, the slope of the side walls follow the (111) crystal plane making an angle of 54.7 degrees to the horizontal (100) crystal plane of the silicon wafer. This has advantages in increasing the amount of viewing area available at high angles of tilt and is particularly useful for electron tomography for three-dimensional reconstruction of structures.

An alternative method to the use of KOH (a wet etching procedure) is to use dry etching techniques such as reactive ion etching (RIE). This utilizes radio frequency (RF) power to create a plasma that drives chemical reactions. Energetic ions supply the necessary energy to allow reactions to occur at low temperatures in the plasma that might otherwise require temperatures in excess of 1000° C. A particular variation on RIE that is relevant to this patent is the development of deep reactive ion etching (DRIE). This technique allows silicon to be etched with a very high aspect ratio and is achieved by an alternate process of etching (e.g. using a gas mixture of $SF_6$ and Ar) and the laying down of a protective Teflon™-based polymer layer. Using this technique, aspect ratios up to 30:1 can be achieved with a practical maximum etch depth of around one millimeter. The etch rate for silicon is two to three micrometers per minute. A precise etch depth can be achieved using a buried $SiO_2$ layer due to the significant decrease in etch rates for silicon dioxide.

With respect to the final shape required for the silicon substrate, the provision of a circular shape confers certain advantages relating to the configuration of typical specimen holders used routinely in transmission electron microscopes for example. The fabrication of a circular silicon substrate is not straightforward. One method is the use of deep reactive ion etching to produce complex patterns of a high aspect ratio. In addition, if desired, the silicon nitride aperture itself can be patterned to give a circular shape. The main limitation of this technique is that in practical use, the etch rates in DRIE instrumentation are uneven so that across a single wafer the rate of etching may differ significantly, with the patterns under- or over-etched, leading to structural non-uniformity.

Alternative methods to achieve the same goal of fabricating a circular silicon substrate utilize micromachining procedures. These include techniques such as laser-assisted chemical etching (LACE), electric discharge machining (EDM) and abrasive waterjet cutting methods.

SUMMARY OF THE INVENTION

The present invention provides a circular silicon substrate with a thin film membrane for use in transmission electron microscopes, which includes a silicon substrate and a silicon nitride thin film deposited on the silicon substrate. More specifically, it provides a silicon substrate onto which is deposited a silicon nitride thin film as an optical and electron transparent substrate for use in transmission electron microscopes (TEMs). The invention is circular in keeping with the requirements of specimen holders used routinely in TEMs and has microscopic surface texture to assist in gripping the substrate. In addition, the nitride membrane may be surface-modified in order to improve the biocompatibility of the substrate for biomedical applications where enhanced cell growth is desirable.

The foregoing and other objects, features, and advantages of the invention will become more readily apparent from the following detailed description of preferred embodiments, which proceeds with reference to the drawings.

DETAILED DESCRIPTION OF THE INVENTION

Figure 1:
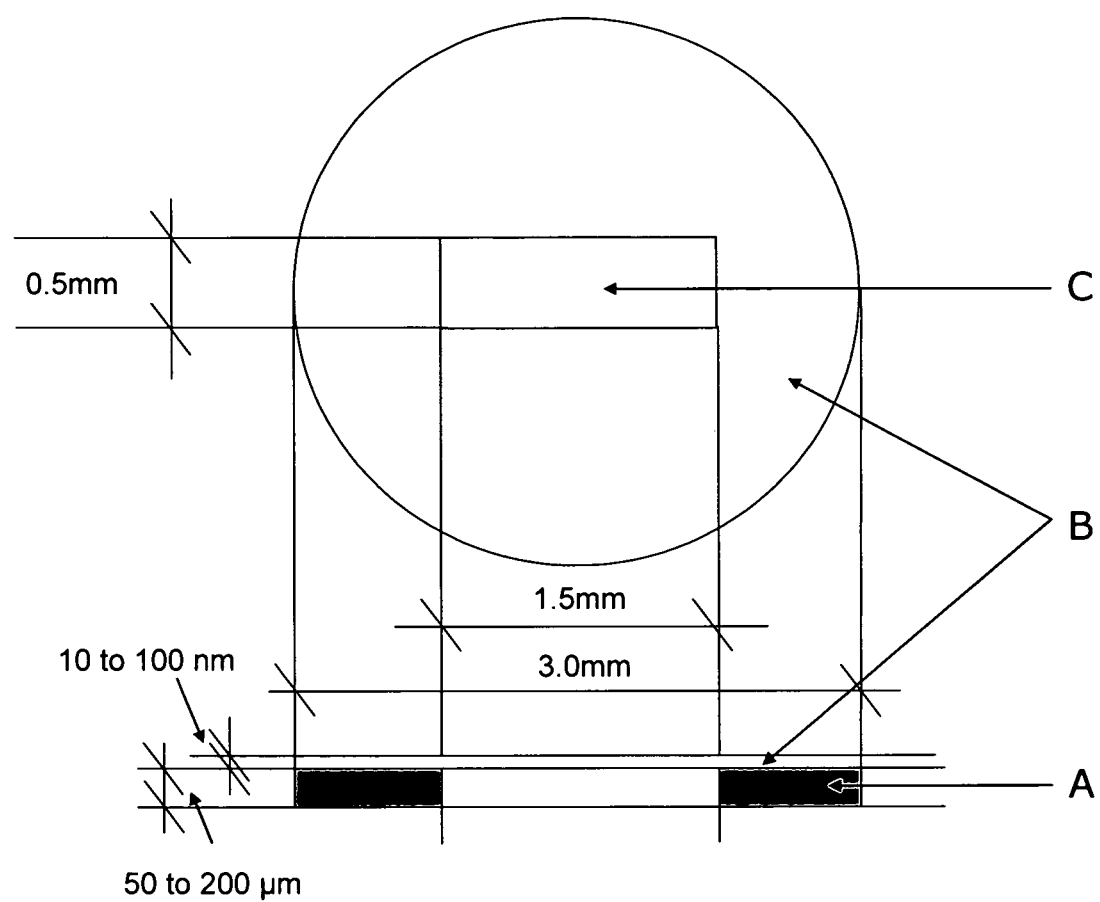
FIG. 1 is a schematic of the silicon substrate (A) showing the deposited silicon nitride (B) thin film suspended over an aperture (C) prepared by deep reactive ion etching according to the present invention.

Transmission electron microscopy is a technique widely used in the disciplines of biological and materials sciences. At its core, it relies on the ability to image through an object following the interaction of electrons with the specimen. This allows the operator to observe a specimen at high spatial resolution for the purpose of identifying composition and structure in relation to a macroscopic property. An example in biological sciences is the study of the chemical synapse of the neuron, whereby transmission electron microscope images of the synapse can be used to understand complex chemical processes in cell-to-cell signaling. An example in the materials science field might be using a transmission electron microscope to image an interface between two dissimilar materials in an attempt to understand the relationship between this structure and some externally measured macroscopic physical property.

In order to fully utilize the transmission electron microscope, it is imperative that electrons are able to penetrate through the specimen. Besides the obvious aspect of making the specimen thin enough, the ability of electrons to traverse through the specimen is dependent upon its composition. The higher the atomic number of the elements that are contained within the specimen, the greater the scattering of electrons that occurs, which in turn reduces the information content of the image. Therefore, given the operating conditions required for a transmission electron microscope, the specimen needs to be fabricated within a thickness range of 50 to 200 nanometers. Exceptions to this general observation exist, particularly in the biological sciences where thick sections are preferred in order to preserve the relationship between comparatively large structures and their sub-cellular parts. In these cases the specimen may be as thick as 500 nanometers.

In any case, in order to image a specimen in a transmission electron microscope, it is usual to mount the specimen onto a grid. Traditionally, this grid has been made from a range of metallic materials (copper, nickel or gold for example), which form a supportive mesh onto which the specimen may be mounted directly or further supported by the use of an additional thin film made from amorphous carbon or Formvar, typically 10 to 50 nanometers in thickness. In the case of carbon, this additional support film also serves the purpose of providing electrical grounding, thereby reducing charging of the specimen, which can be deleterious to obtaining an image of it. Besides the use of continuous films, support films can be fabricated to include random holes across the surface. This offers the advantage of imaging the specimen directly in the electron beam without the electron traversing the additional thickness associated with the support film, especially useful when attempting to perform atomic resolution imaging.

Using the above traditional techniques has proven very successful for the majority of applications; however, there are some disadvantages to the use of these substrates, mainly related to planarity and in some cases, a lack of chemical inertness. As an example of these limitations, automated TEM procedures for large-scale analysis of biological specimens benefit from a planar substrate so that minimal changes in focus or astigmatism correction are required between subsequent specimens on the same support grid. This in turn leads to an increase in the speed of data collection. Chemical inertness is an issue when electron microscopists are interested in depositing thin films directly on the support grid for TEM analysis. For example, the use of chemical vapor deposition (CVD)-type reactors is a common practice in the fabrication of thin films for semiconductor applications. In order to prepare a TEM specimen, it might be necessary to expose the support grid to high temperatures as well as various chemicals. The presence of the support grid may contaminate the sample of interest or may itself undergo a chemical/structural change, making it unusable.

More recently, silicon substrates with silicon nitride thin film membranes have been fabricated and distributed to electron microscopists by a number of commercial companies. These support grids highlight the advantages of silicon nitride thin films, such as their planarity and chemical inertness. The three main disadvantages limiting the widespread adoption of these substrates are: first, their manufacturing costs; second, their intrinsic brittleness and fragility; and third, their lack of circularity making them incompatible with traditional specimen holders. It is these last two aspects that are the subject of this patent. Regarding the first disadvantage, semiconductor fabrication is by its nature an expensive process due in part to the need for ultra-clean fabrication facilities and ultra-pure materials. It is difficult therefore to significantly reduce manufacturing costs without impacting the quality of the silicon nitride membranes. The second and third disadvantages are intrinsically related. In attempting to produce a shape that is near-circular, the undesirable qualities relating to brittleness, handling and fragility are increased. For this reason, the steps required to fabricate the final shape of the substrate are outlined below.

Most commercial transmission electron microscopes require a circular substrate three millimeters in diameter. The traditional and most cost-effective method of fabricating standard silicon substrates is with a dicing saw. A thin diamond blade is used to either score or cut the silicon substrate, thereby rendering the final shape of the die, which in most semiconductor devices is square or rectangular. By careful choice of cutting direction it is possible to reduce the square shape of the die to a near-circular shape. This is achieved by additionally cutting or scoring the corners of the square die to make a pseudo-circular die that loosely fits inside a traditional TEM holder.

The major disadvantage of the use of this dicing procedure is that it results in an irregular jagged edge. This has two impacts: first, it leads to increased difficulty in handling the specimen (due to the irregularity of the surface for gripping with tweezers), and second, these features provide microscopic flaws in the silicon surface that result in an increased risk of fracture of the die. This can become particularly significant as the silicon die thickness is reduced. For the majority of TEM specimen holders, a die or substrate thickness of 200 micrometers is adequate. However, for some state-of-the-art tomography TEM holders, a substrate thickness of around 50 micrometers is preferred, leading to a potential increased risk of fracture of the die supporting the silicon nitride thin film.

This invention therefore specifically targets methods for the fabrication of circular substrates for transmission electron microscopy. The fabrication methods avoid using the traditional approach of dicing. In some of the accompanying figures, the silicon nitride TEM aperture and the circular shape were fabricated using a DRIE process. As a result of this approach it is possible to fabricate a 3.0 millimeter circular silicon substrate with a microscopically-textured surface that is easier to handle with tweezers, along with a silicon substrate that is less likely to fracture. In addition, using this approach leads to higher packing density on a silicon wafer and can lead to a higher production yield, particularly when considering silicon substrate thicknesses of 50 micrometers or less.

Along with deep reactive ion etching, other micromachining operations can be used to fabricate a circular shape such as those based on laser micromachining. Furthermore, instead of DRIE for fabricating the aperture beneath the thin film membrane, a traditional KOH etching process can be used.

A further embodiment of this invention is the incorporation of surface chemistries known to improve the biocompatibility and suitability of the silicon nitride thin films to support biological applications. The requirement for this addition is that the surface modifications not hinder or subtract any information intrinsic to the specimen. In order to achieve this, the surface modification must be sufficiently thin enough (i.e., no greater than 50 nanometers), be totally amorphous, and provide a substrate onto which cells or biological material will readily adhere. Two examples of this are the use of a thin film of diamond-like carbon and atomic layer-deposited aluminum hydroxide. Both of these approaches yield amorphous biocompatible surfaces that can be applied using established techniques to silicon nitride substrates (J. Franks and D. S. Finch, 1984, Finch, et al. 2006).

Referring now to FIGS. 1 through 3B, FIG. 1 is a schematic of the silicon substrate showing the deposited silicon nitride thin film where Part A is the silicon substrate, Part B is the silicon nitride thin film, and Part C is the aperture etched using deep reactive ion etching. It should be noted that it is common practice to include a thin (~50 to 100 nm) silicon oxide layer between the silicon substrate and the silicon nitride to aid in adhesion between the two materials.

Figure 2:
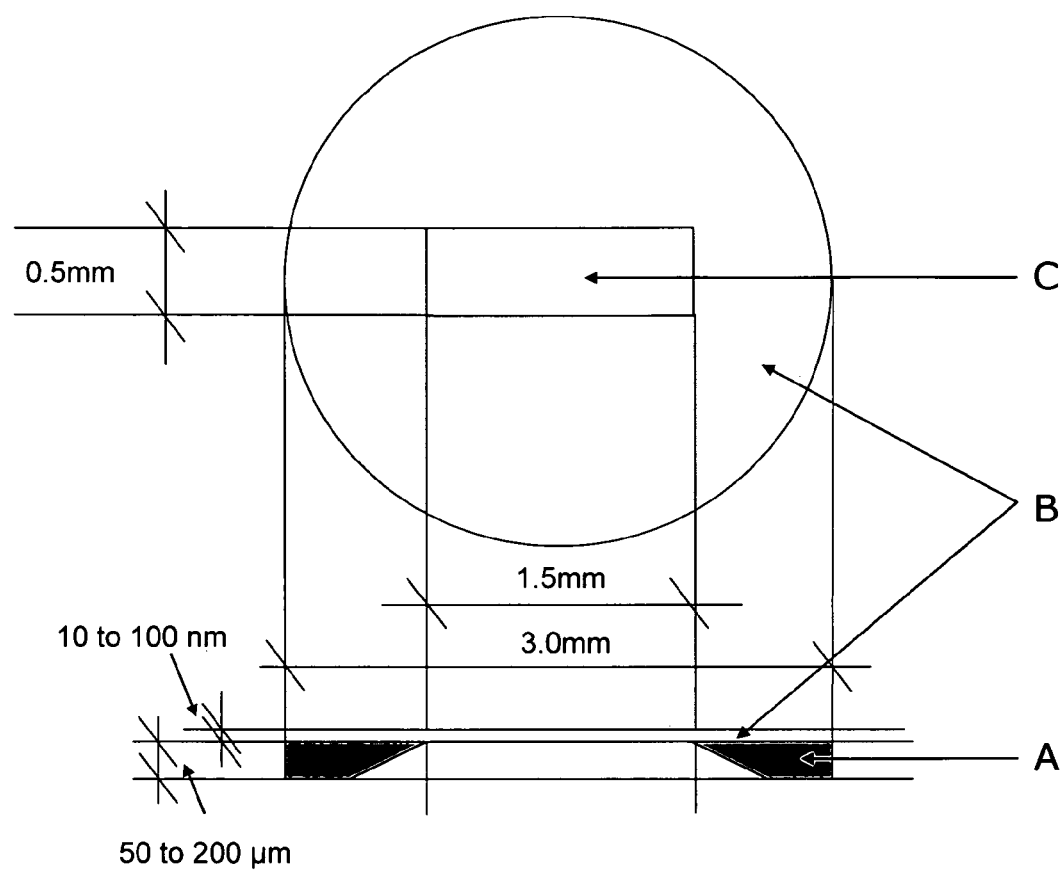
FIG. 2 is a schematic of the silicon substrate (A) showing the deposited silicon nitride (B) thin film suspended over an aperture (C) prepared by KOH etching according to the present invention.

FIG. 2 is a variation on that shown in FIG. 1 where Part A is the silicon substrate, Part B is the silicon nitride thin film, and Part C is an aperture etched using potassium hydroxide (KOH).

Figure 3A:
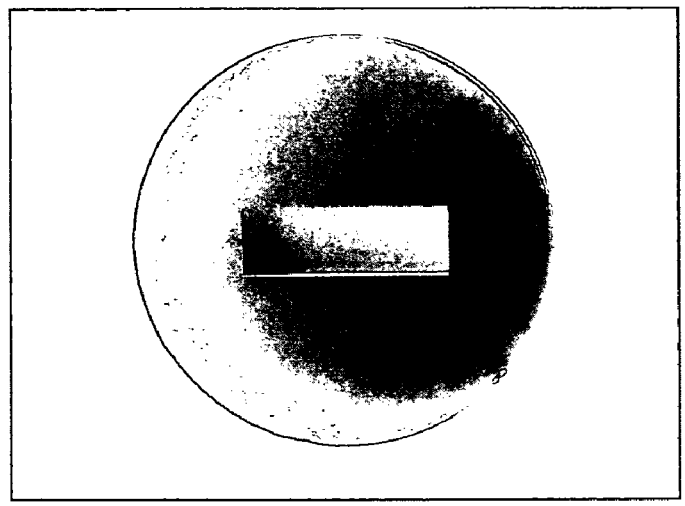
FIG. 3A is a scanning electron micrograph of a silicon substrate onto which is deposited a silicon nitride thin film fabricated using deep reactive ion etching, according to the present invention.
Figure 3B:
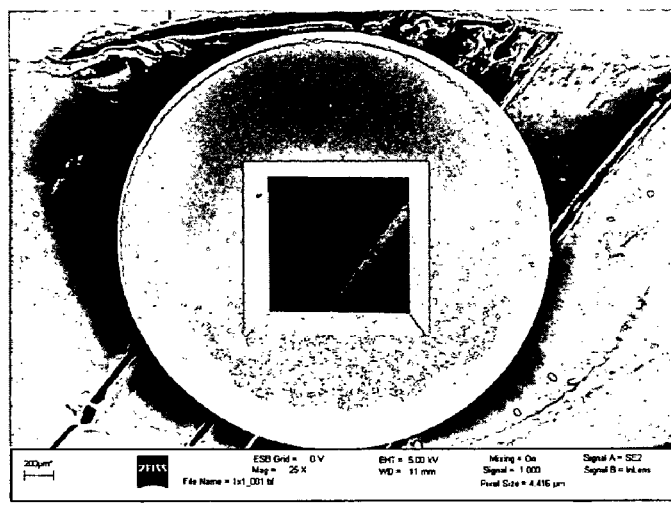
FIG. 3B is a scanning electron micrograph of a silicon substrate onto which is deposited a silicon nitride thin film fabricated using laser micromachining, according to the present invention.
Figure 3C:
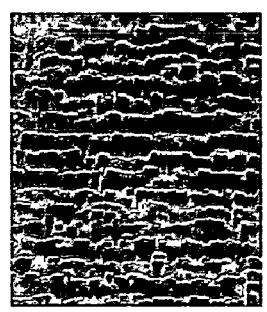
FIG. 3C is a scanning electron micrograph illustrating the microscopic surface textures on the gripping surfaces that assist in specimen handling according to the present invention.
Figure 3C:
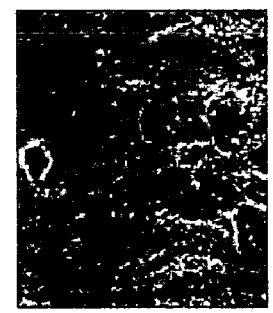

FIGS. 3A through C are scanning electron micrographs of a silicon substrate onto which is deposited a silicon nitride thin film. Figure A shows how the circular shape has been fabricated using deep reactive ion etching and Figure B, using laser micromachining techniques. FIG. 3C shows a detailed image of the microscopic surface textures produced by deep reactive ion etching and laser micromachining on the gripping surface that assist in specimen handling.

REFERENCES

Dino R. Ciarlo. Silicon Nitride Thin Windows for Biomedical Microdevices. Biomedical Microdevices, 4: 1, 63-68, 2002.

Joe Franks and Dudley S. Finch. Medical Applications of Diamond-like Carbon Coatings. Nanotechnology in Medicine and the Biosciences, University of London Royal Postgraduate Medical School Publication, March 1984.

Dudley S. Finch, Tammy Oreskovic, Krishna Ramadurai, Cari F. Herrmann Abell, Steven George and Roop L. Mahajan. Cytotoxicity Study of Vascular Smooth Muscle Cells Applied to Conformal Atomic Layer-deposited Alumina Thin Films for Bio-MEMS Applications, in press, Journal of Biomaterials Research, 2006.

I claim:

1. A circular substrate with an amorphous thin film membrane for use in transmission electron microscopes, comprising:
    a silicon substrate having a microscopic surface texture, wherein the microscopic surface texture is incorporated into the edge of the substrate; and
    a thin film membrane of silicon nitride, silicon oxide, silicon oxynitride, boron nitride, boron carbon nitride, or carbon nitride deposited on the silicon substrate.

2. The thin film membrane of claim 1 wherein its thickness ranges from five nanometers to several micrometers in thickness.

3. The circular silicon substrate of claim 1 further comprising an aperture having a shape selected from the group of shapes consisting of circular, square or rectangular.

4. The circular silicon substrate of claim 3 wherein the aperture is fabricated using an etching process.

5. The circular silicon substrate of claim 3 wherein the geometry of the aperture is optimized for imaging at high angles of specimen tilt.

6. The thin film membrane of claim 1 wherein the surface of the thin film membrane is chemically modified.

7. The thin film membrane of claim 6 wherein surface modification increases the wettability of the surface.

8. The thin film membrane of claim 7 wherein the surface modification comprises attaching various hydroxylated functional groups.

9. The thin film membrane of claim 6 wherein the surface modification is achieved using atomic layer deposition, chemical vapor deposition or self-assembled molecular techniques.

10. The thin film membrane of claim 6 wherein the surface modification of the substrate increases the biocompatibility of the surface.

11. The thin film membrane of claim 10 wherein biocompatibility of the substrate is modified using molecules known to promote such properties while not impeding electron or optical transparency.

12. The thin film membrane of claim 11 wherein the promoting molecule is selected from the group consisting of diamond-like carbon moieties and hydroxylated alumina.

* * * * *